United States Patent [19]

Nakamura et al.

[11] Patent Number: 4,982,114

[45] Date of Patent: Jan. 1, 1991

[54] SEMICONDUCTOR LOGIC DEVICE HAVING TWO-DIMENSIONAL LOGIC ARRAYS AND LOGIC CELL CHAINS ALTERNATELY ARRANGED

[75] Inventors: Hideo Nakamura, Tokyo; Terumi Sawase, Sayama; Makoto Hayashi, Tokyo, all of Japan

[73] Assignees: Hitachi, Ltd.; Hitachi VLSI Engineering Corporation, both of Tokyo, Japan

[21] Appl. No.: 343,289

[22] Filed: Apr. 26, 1989

[30] Foreign Application Priority Data

Apr. 27, 1988 [JP] Japan .................................. 63-102547

[51] Int. Cl.⁵ ...................................... H03K 19/177
[52] U.S. Cl. .................................... 307/465; 307/468; 357/45
[58] Field of Search ............... 307/443, 465, 466, 468, 307/475; 357/45

[56] References Cited

U.S. PATENT DOCUMENTS

| | | | |
|---|---|---|---|
| 4,161,662 | 7/1979 | Malcolm et al. | 307/465 |
| 4,750,027 | 6/1988 | Asami | 357/45 |
| 4,772,811 | 9/1988 | Fujioka et al. | 307/465 |
| 4,786,904 | 11/1988 | Graham, III et al. | 307/465 X |
| 4,846,381 | 9/1989 | Seefeldt et al. | 307/465 X |

OTHER PUBLICATIONS

Brickman et al, "Programmable Logic Array Logic Enhancement", IBM T.D.B., vol. 19, No. 2, Jul. 1976, p. 583.

Primary Examiner—David Hudspeth
Attorney, Agent, or Firm—Antonelli, Terry, Stout & Kraus

[57] ABSTRACT

A semiconductor logic device having arrays of logic elements and chains of logic cells alternately arranged in a direction substantially perpendicular to the direction of the chains of logic cells in a surface portion of a semiconductor substrate. Each of the logic element arrays has input and output leads extending from the array in the above-mentioned direction substantially perpendicular to the direction of the chains of logic cells so that each of said logic cell chains is in an electrical connection with two adjacent logic element arrays via the input and output leads.

24 Claims, 9 Drawing Sheets

F I G. 13
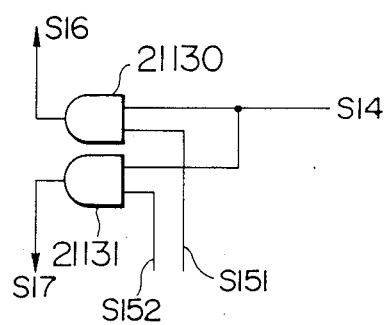

SEMICONDUCTOR LOGIC DEVICE HAVING TWO-DIMENSIONAL LOGIC ARRAYS AND LOGIC CELL CHAINS ALTERNATELY ARRANGED

BACKGROUND OF THE INVENTION

This invention relates to semiconductor logic devices which can be integrated in high density and more particularly to a semiconductor logic device suitable for electrically rewriting the logic design or structure.

In the past, a logic LSI comprised of standard cells or gate arrays has been known. Programmable logic devices comprised of electrically rewritable or programmable elements are described in, for example, U.S. Pat. No. 4,124,899 (issued to Birkner et al on Nov. 7, 1978), U.S. Pat. No. 4,609,986 (issued to Hartmann et al on Sept. 2, 1986), U.S. Pat. No. 4,642,487 (issued to Carter on Feb. 10, 1987) and JP-A-61-280120. A relevant description is also given in ISSCC (International Solid-state Circuits Conference) 86 (1986), pp. 244-245.

In the prior art logic LSI, layout of cells and wiring in the standard cells or gate arrays are changed by changing the mask pattern in the course of fabrication of the LSI to obtain a desired logic design. This raises a problem that it takes a long time to materialize an LSI having necessary functions.

On the other hand, the prior art programmable logic device using electrically programmable elements is insufficient to realize a large-scale and high-integration-density logic design. For example, in the aforementioned U.S. Pat No. 4,124,899, the wiring between mutually relatively distant logic cells and the structure of multi-stage logic are not considered which become problematic as the scale of logic increases. According to a description given on pp. 244-245 and 359-360, 1986 IEEE ISSCC, a feedback path is used for constructing a multi-stage logic, but the array has a structure in which all word lines intersect with all output lines. The aforementioned U.S. Pat. No. 4,609,986 uses a hierarchical array structure having a global feedback path and a local feedback path but logic between discrete logic cells is of the global feedback path and constructed on a common array.

On the contrary, in the aforementioned U.S. Pat. No. 4,642,487 and JP-A-61-280120 laid open on Dec. 10, 1986, logic cells are interconnected together by a dedicated wiring having a bus switch.

SUMMARY OF THE INVENTION

An object of the present invention is to provide a semiconductor logic device so constructed as to have high integration density and/or high extensibility.

Another object of the invention is to provide a large-scale and high-integration-density semiconductor logic device having ability to electrically program or rewrite the logic structure.

According to one aspect of the invention, a plurality of arrays of logic elements and a plurality of chains of logic cells are formed in a surface portion of a semiconductor substrate, with the logic element arrays and the logic cell chains being alternately arranged in a direction substantially perpendicular to the direction of the logic cell chain. Each of the logic element arrays has input leads and output leads extending in the direction of the alternate arrangement and therefore logic cells of respective logic cell chains can effect signal transmission and reception to and from adjacent logic element arrays through their input and output leads.

According to another aspect of the invention, a plurality of arrays of logic elements are formed in a surface portion of a semiconductor substrate, the logic element arrays being arranged in first and second directions substantially perpendicular to each other, a plurality of chains of logic cells are arranged in the first and second directions, with the logic cell chains and the logic element arrays being alternately arranged in the first direction and with the direction of the logic cell chain being substantially parallel to the second direction, and a plurality of switching circuits are each connected between two of the logic element arrays which are adjacent to each other in the second direction, each switching circuit being operable to selectively interconnect the adjacent logic element arrays. Each of the logic element arrays has input and output leads which extend in the first direction and therefore logic cells of respective logic cell chains can effect signal transmission and reception to and from adjacent logic element arrays through their input and output leads.

A logic element of the logic element array may be a programmable element (for example, a NOR element comprised of an electrically programmable element). A logic cell of the logic cell chain may have a construction wherein different logic functions can be performed in accordance with external control signals or control data. The arrangement of the logic cell chains and NOR arrays permits logic processing in cooperation with adjacent NOR arrays and logic cells or signal propagation between adjacent NOR arrays and logic cells.

In addition, direct interconnection lines are provided which can permit dedicated or time-division signal propagation independently of the above constitutional components, whereby high-speed signal propagation between discrete (relatively distant) logic cells can be ensured.

In accordance with an embodiment of the invention, each logic cell receives a plurality of output signals from one of adjacent NOR arrays and delivers to the other adjacent NOR array and/or an additionally provided direct interconnection line an output signal according to a preset logic function or an output signal according to a logic function set by a function control signal from the one adjacent NOR array through a preset output path or an output path set by a signal from the one adjacent NOR array.

Each NOR array receives output signals from one of adjacent logic cell chains and delivers to the other adjacent logic cell chain desired logic output signals. Line switches or bus switches may be provided at predetermined intervals for cooperation with input/output leads of the NOR arrays to give divided arrays. Alternately, the input/output leads of the NOR arrays are connected to form a single common array. In the NOR array, output lines are respectively associated with individual input lines to form logic elements each of which can also act to electrically interconnect one output line and the associated input line. The direct interconnection line is adapted to supply data to the logic cell at a predetermined interval of time and it also serves as a wiring connection line.

Thus, by combining the NOR array and logic cell chain, a desired logic can be set up or extension of logic can be ensured. The NOR array also has the function of connecting wirings and therefore work loaded on dedicated wirings can be reduced. By using the additional direct interconnection line as a dedicated line or a time-division line as necessary, high-speed data transfer and efficient use of wiring channel can be realized between discrete logic cells.

This can realize logic designs of desired scale in high density and discretely and permit the provision of a large-scale and high-integration-density semiconductor logic device having ability to electrically program or rewrite the logic structure.

BRIEF DESCRIPTION OF THE DRAWINGS

FIG. 13 is a circuit diagram showing an embodiment of an output switch circuit of the logic cell shown in FIG. 3.

DESCRIPTION OF THE PREFERRED EMBODIMENTS

Figure 1:
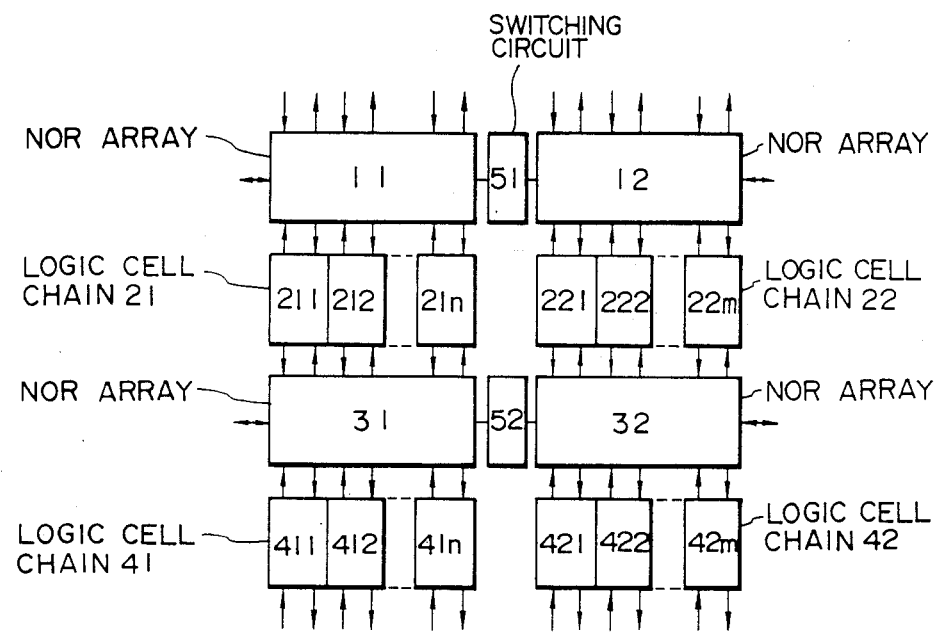
FIG. 1 is a block diagram showing the construction of an embodiment of a semiconductor logic device according to the invention.

FIG. 1 shows the construction of an embodiment of a semiconductor logic device formed in the surface of a semiconductor substrate (not shown).

The semiconductor logic device comprises arrays 11, 31, . . . of logic elements and chains 21, 41, . . . of logic cells, with the logic element arrays and logic cell chains being alternately arrayed in the vertical direction in the illustration of the drawing. Each of the logic element arrays 11, 31, . . . has vertically extending input leads and output leads and signal transmission/reception is effected between each logic element array 11 or 31 and corresponding logic cells 211, 212, . . . of adjacent logic cell chain 21 which extends horizontally in the illustration of the drawing or corresponding logic cells 411, 412, . . . of adjacent logic cell chain 41 which also extends horizontally.

Further arrays 12, 32, . . . of logic elements may also be formed laterally of the logic element arrays 11, 31, . . . in the illustration of FIG. 1 and switching circuits 51 and 52 comprised of, for example, bidirectional switching elements may respectively be inserted between the two laterally adjacent logic element arrays 11 and 12 and between the two laterally adjacent logic element arrays 31 and 32, with the logic element arrays 12, 32, . . . and the logic cell chains 22, 42, . . . being alternately arranged in the vertical direction, thus providing a design of two-dimensional arrangement as a whole.

Each of the logic cell chains 21, 41, . . . is called a macrocell array and may be a semi-custom logic module having built-in (fixed) logic circuits, latches and the like in combination.

The logic design or structure of the respective logic cell chains 21, 22, 41, 42, . . . may desirably be determined by data stored in a control parameter memory built in each cell.

Each of the logic element arrays 11, 12, 31, 32, . . . arranged two-dimensionally is formed, in this embodiment, of a NOR array comprising electrically programmable non-volatile memory elements and assists in providing each of the logic cell chains 21, 22, 41, 42, . . . with variable logic design function.

Accordingly, the logic design or structure of the entire programmable logic device shown in FIG. 1 is determined by a combination of the logic of respective logic cell chains 21, 22, 41, 42, . . . and the logic of respective NOR arrays 11, 12, 31, 32, . . . .

Since the signal line in the NOR arrays 11, 12, 31, 32, . . . can also be used as a wiring channel (electrical interconnection) as will be detailed later, the programmable logic device is suited for formation into a large-sized logic LSI.

Further, as will be described later in greater detail, since the wiring channels of the laterally adjacent NOR arrays 11 and 12 can be connected mutually by enabling the bidirectional switching element 51 and the wiring channels of the laterally adjacent NOR arrays 31 and 32 can be connected mutually by enabling the bidirectional switching element 52, extension of logic scale can be realized easily.

Therefore, the logic scale of the programmable logic device of this embodiment can be extended as a whole by extending the FIG. 1 construction in the vertical (first) direction and in the horizontal (second) direction.

Figure 2A:
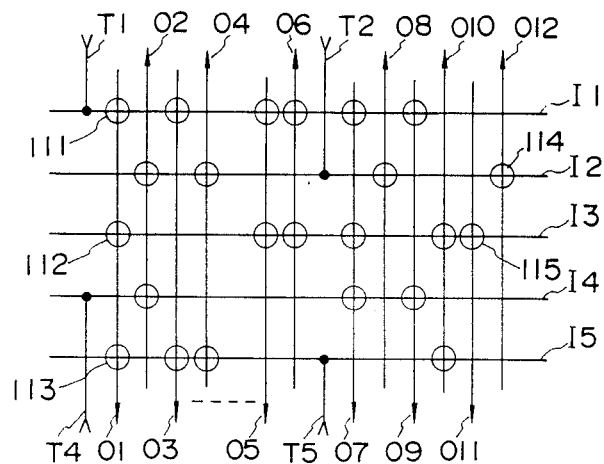
FIG. 2A is a diagram showing an example of a programmable logic element used in the FIG. 1 device.

The NOR array per se is two-dimensional in this embodiment and an example of construction of the programmable two-dimensional NOR array is illustrated in FIG. 2A. Referring to FIG. 2A, I1 to I5 designate common input lines and 01 to 012 designate output lines. The number of input lines and the number of output lines may be determined desirably. The input lines are substantially perpendicular to the output lines and electrically programmable or rewritable non-volatile memory elements are disposed at intersections. The input lines I1 to I5 are respectively connected to input leads T1 to T5 which extend in parallel with the output lines 01 to 012, that is, in the vertical direction (which is substantially perpendicular to the direction of the logic cell chains shown in FIG. 1), and input signals are supplied from the outside of the NOR array via the leads T1 to T5. End portions of the output lines 01 to 012, like the input leads, extend in the vertical direction to terminate in output leads. The ratio between the number of the input and output leads on one side of the NOR array and the number of the input and output leads on the opposite side is determined suitably, and the input and output leads are provided on each side at suitable intervals. The input and output leads can be laid at constant pitches by extending them alternately from the opposite sides in this manner. In FIG. 2A, a circle mark at an intersection of input and output lines indicates a state in which data is written in the non-volatile memory device at this intersection which acts as a MOS switch but no circle mark at an intersection indicates a state in which data is not written in the non-volatile device at this intersection which does not act as the MOS switch. Taking the output line 01, for instance, the MOS switch operation can take place at intersections 111, 112 and 113 to provide a logic output of $01 = \overline{I1} + \overline{I3} + \overline{I5}$. On the output line 012 or 011, the MOS switch operation can take place only at an intersection 114 or 115 to provide $012 = \overline{I2}$ or $011 = \overline{I3}$, indicating that equivalent effect to electrical interconnection of the input and output lines can be obtained. Therefore, the NOR array can also be used as wiring between logic cells in the programmable logic device. In the example of FIG. 2A, the input line I3 can cooperate with the output line 011 to achieve wiring operation and cooperate with the output line 01 to provide a NOR output signal, thus materializing wiring and NOR logic simultaneously. Accordingly, by forming the logic cell chains 21, 22, 41, 42, . . . and the NOR arrays 11, 12, 31, 32, . . . in the semiconductor substrate in such a manner that, as shown in FIG. 1, the logic cell chains 21, 41, . . . and the NOR arrays 11, 31, . . . are arranged alternately and the logic cell chains 22, 42, . . . and the NOR arrays 12, 32, . . . are also arranged alternately, the wiring and logic can be materialized efficiently. In addition, since the logic cell chains 21, 22, 41, 42, . . . and the NOR arrays 11, 12, 31, 32, . . . are interconnected together through the input and output leads so as to be arranged in two-dimensional array configuration, the logic and wiring are not concentrated locally and large-scale logic can be materialized efficiently. Further, the NOR arrays aligned in the lateral direction may act as a common memory operable with a common control circuit for write/erase, and the number of peripheral circuits for write/erase can be reduced.

Figure 2B:
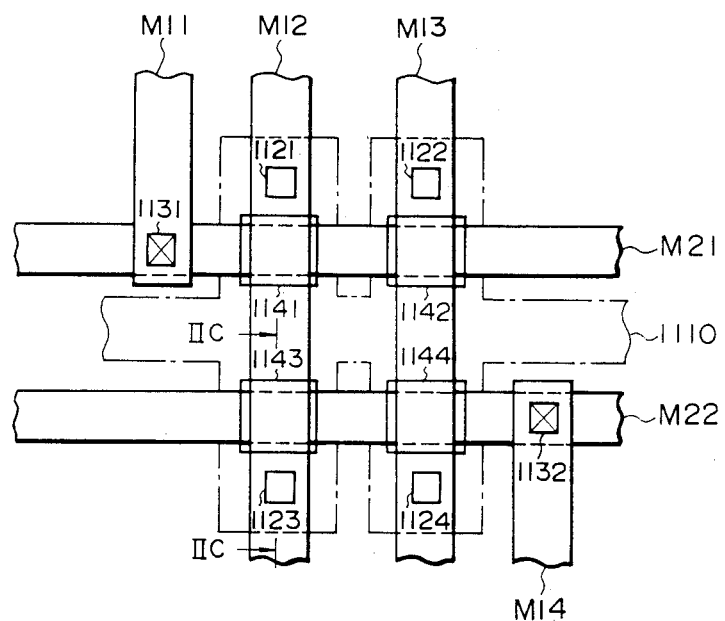
FIG. 2B is a fragmentary diagram showing the geometrical layout of part of FIG. 2A.
Figure 2C:
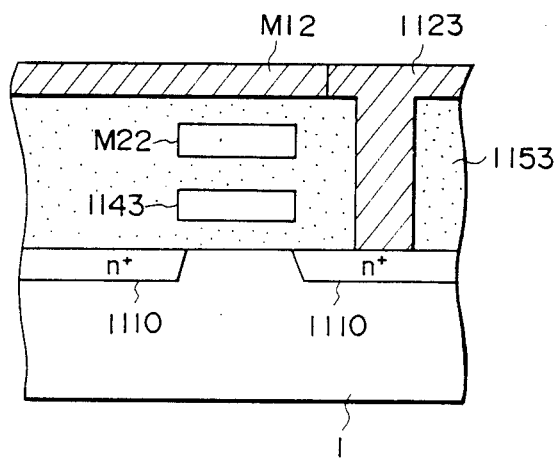
FIG. 2C is a sectional view taken on the line IIC—IIC of FIG. 2B.

The FIG. 2A array may be realized with a layout structure as shown in FIG. 2B, having programmable nonvolatile memory elements constructed as shown in FIG. 2C being a sectional view taken on the line IIC—IIC of FIG. 2B. Referring to FIG. 2B, M11 to M14 designate first layers of wiring (for example, aluminum layers), and the first wiring layers M11 and M14 correspond to the input leads T1 and T2 of FIG. 2. The first wiring layers M12 and M13 correspond to the output lines 01 and 02. Second layers of wiring M21 and M22, insulated from the first wiring layers by an insulating layer (1153), underlie the first wiring layers to extend perpendicularly thereto and act as gate electrodes. Of the second wiring layers (for example, tungsten silicide layers), the layer M21 corresponds to the input line I1 and the layer M22 corresponds to the input line I2. Information storage layers (for example, $Si_3N_4$ layers) 1141 to 1144, insulated from the second wiring layers, lie between the respective second wiring layers and a substrate 1 and serve as floating gates. Diffusion layers 1110 are formed in the surface of the substrate. Denoted by 1121 to 1124 are contacts for connecting the first wiring layers and the diffusion layers, and by 1131 and 1132 are contacts for connecting the first wiring layers and the second wiring layers.

Figure 3:
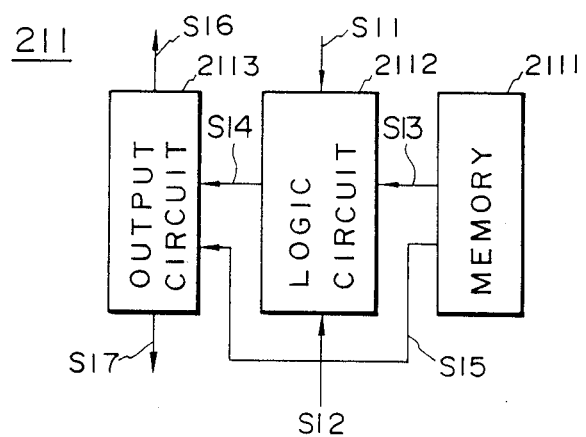
FIG. 3 is a diagram showing an example of the construction of a logic cell.

Each of the logic cells 211 to 42m serving as programmable macrocells in the FIG. 1 logic device may exemplarily be constructed as shown in FIG. 3. Referring to FIG. 3, 2112 designates a precedently built-in (fixed) logic circuit, 2111 a memory for storing operation control parameters, and 2113 an output circuit. The logic design of the logic circuit 2112 and the connection design of the output circuit (switch circuit) 2113 may desirably be set up by control parameter data stored in the memory 2111 and transmitted as signals S13 and S15. Input signals S11 and S12 to the logic cell are supplied from the output lines 01 to 011 shown in FIG. 2A. Output signals S16 and S17 from the logic cell are supplied to the input leads T1 to T5 shown in FIG. 2A. The output signals S13 and S15 from the memory 2111 respectively control the logic design of the logic circuit 2112 and the connection design of the output switch circuit 2113. An output signal S14 from the logic circuit 2112 drives the output switch circuit 2113 so that designated output signals S16 and S17 may be delivered out of the output switch circuit 2113.

Figure 4:
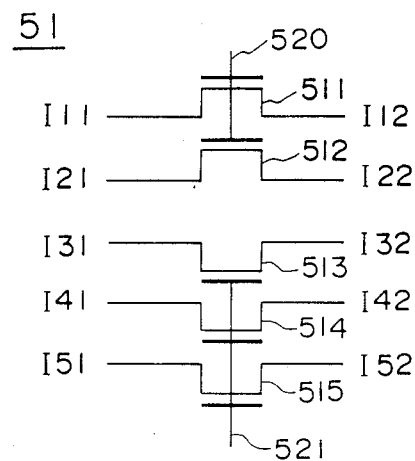
FIG. 4 is a circuit diagram of an embodiment of a bidirectional switching element.

FIG. 4 shows an embodiment of the bidirectional switching element 51 or 52 of FIG. 1 used for extending the logic scale. The following description will be given by way of the switching circuit 51. The bidirectional switching element 51 comprises MOS switches 511 to 515 which operatively interconnect signal lines I11 to I51 from the NOR array 11 and signal lines I12 to I52 from the NOR array 12. Since the MOS switches 511 and 512 can be on/off controlled by applying a control signal 520 to their gates and the MOS switches 513 to 515 can be on/off controlled by applying a control signal 521 to their gates, either interconnection or disconnection of input lines between the laterally adjacent NOR arrays 11 and 12 can be effected using the control signals 520 and 521 having suitable voltage level. Thus, when the bidirectional switching element 51 is placed in connection condition, the NOR arrays 11 and 12 act as a single NOR array but when the element 51 is placed in disconnection condition, the respective NOR arrays 11 and 12 act as independent NOR arrays. The bidirectional switching element 52 associated with the NOR arrays 31 and 32 is constructed and operated in exactly the same manner. If the individual gates of the MOS switches 511 to 515 are supplied with independent control signals, connection and disconnection of individual input lines can be effected. If all the gates of the MOS switches 511 to 515 are supplied with a common control signal, connection and disconnection of input lines can be effected collectively.

Accordingly, by placing the bidirectional switching element 51 in connection condition to permit the NOR arrays 11 and 12 to operate as a single NOR array, the logic scale can be extended. This can be true for the NOR arrays 31 and 32 associated with the bidirectional switching element 52.

Figure 5:
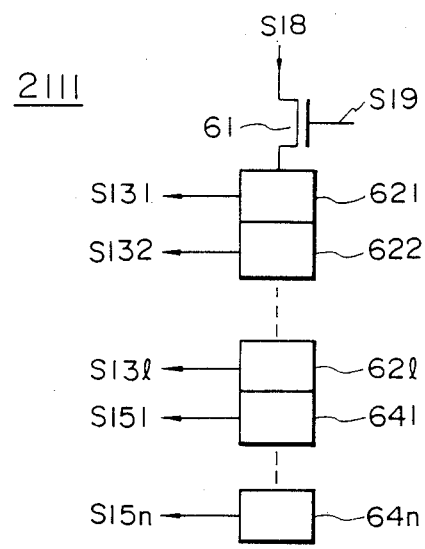
FIG. 5 is a diagram showing an embodiment of an operation control parameter memory of the FIG. 3 logic cell.

FIG. 5 shows an embodiment of the control parameter memory 2111 shown in FIG. 3. Referring to FIG. 5, 61 designates a switching element, 621 to 62*l* and 641 to 64*n* shift registers, S131 to S13*l* output signals delivered from the memory 2111 to the logic circuit 2112, and S151 to S15*n* output signals delivered from the memory 2111 to the output switch circuit 2113. An input signal S18 is generated by the NOR array 11, 12, 31 or 32 and supplied to the memory 2111. The memory 2111 is rendered ready for setting control parameters by a control parameter setting enable signal S19. When setting operation control parameter data in the memory 2111, the switching element 61 is turned on by the signal S19 so that the data supplied from the NOR array in the form of the signal S18 is sequentially read and written into the shift registers 621 to 62*l* and 641 to 64*n*.

Figure 7:
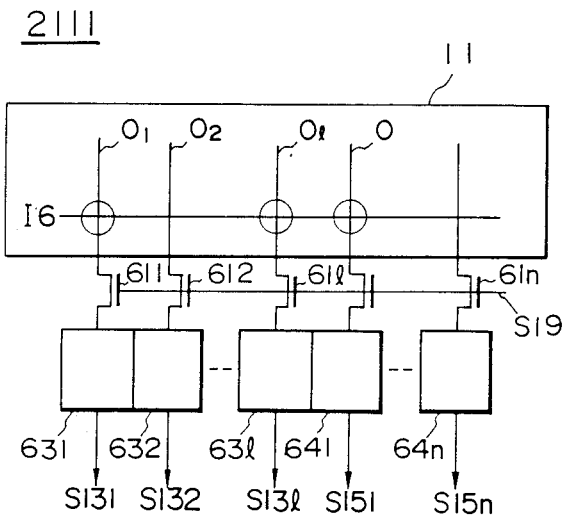
FIG. 7 is a diagram showing another embodiment of the control parameter memory.

FIG. 7 shows another embodiment of the control parameter memory 2111 shown in FIG. 3. Referring to FIG. 7, 631 to 63*l* and 641 to 64*n* designate registers, and 611 to 61*n* switching elements. By turning on the switching elements 611 to 61*n* by the signal S19, control parameter data stored in electrically programmable non-volatile memory elements connected to a specified input line I6 of, for example, the NOR array 11 can be set simultaneously in the registers 631 to 63*l* and 641 to 64*n* through the switching elements 611 to 61*n*. In the embodiments of FIGS. 5 and 7, the control parameter data is stored in part of the NOR array and therefore the NOR array used in essentiality or inherently for logic or wiring operation in the semiconductor logic device can also be utilized for storage of the control parameter data and the write control and test circuit can be used in common for logic/wiring and storage functions, thereby improving economy of layout. Accordingly, any changes in the function of the logic device can be accomplished by rewriting non-volatile memory elements of the NOR array.

Figure 6A:
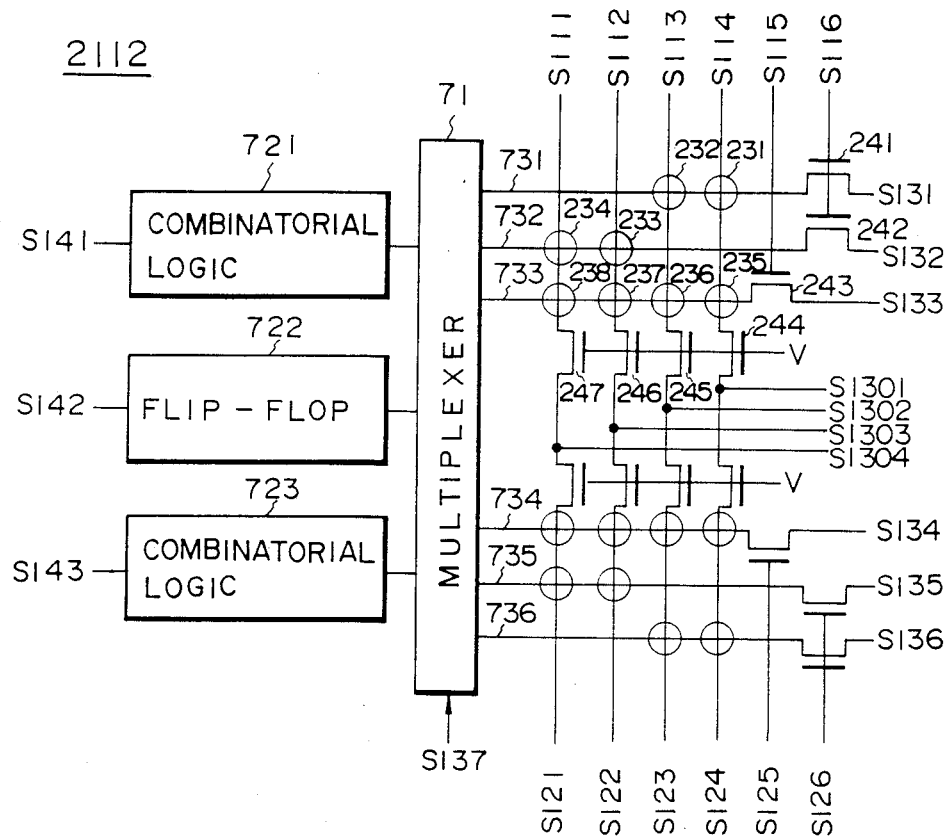
FIGS. 6A and 6B are circuit diagrams showing an embodiment of a logic circuit built in the FIG. 3 logic cell.
Figure 6B:
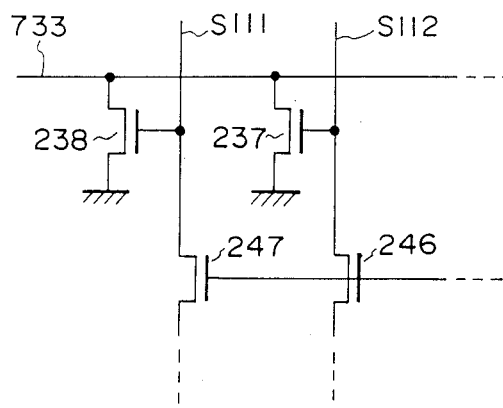

FIG. 6A shows an embodiment of the logic circuit 2112 shown in FIG. 3, and FIG. 6B details part of FIG. 6A. Referring to FIG. 6A, 231 to 238 and 241 to 247 designate transistor switches (see FIG. 6B), S111 to S116 and S121 to S126 input lines of the logic circuit which are connected to the output lines of the NOR array 11, 12, 31 or 32, S131 to S136, S1301 to S1304 and S137 are input lines for receiving the signal S13 from the control parameter memory 2111, 71 a multiplexer, 721 and 723 combinatorial logic circuits and 722 a flip-flop. Alternately, each of the members may be constituted by a combination of a flip-flop and a combinatorial logic circuit. The signal state on a line 733 is determined by a logical expression of (S111·S1304+S112·S1303+S113·S1302+S114·S1301)·S115·S133. The signal states on lines 731 and 732 are determined by similar logical expressions. Thus, results of any desired AND·OR logics of any variables of the input signals S111 to S116 (signals on the input lines S111 to S116) inputted to the logic circuit 2112 are given on lines 731 to 733, depending on the (conditions of) control parameters S131 to S133 and S1301 to S1304. In connection with the input lines S121 to S126 to the opposite side of the logic circuit 2112, a similar logic can be established on individual lines 734 to 736.

These signals on the lines 731 to 736 are passed through the multiplexer 71, combinatorial logic circuits 721 and 723 and flip-flop 722 to provide output signals S141 to S143 of the logic circuit. A similar logic design to that of FIG. 6A can be set up as desired by changing the number of input lines S111 to S116 and S121 to S126, the number of logic signal lines 731 to 736 and the logical expression. Since the transistor switches 231 to 238 in FIG. 6A, fixed in structure, are formed through mask patterns and the combination of the transistor switches is controlled using the control parameters S131 to S133 and S1301 to S1304, the logic cell section of the logic circuit in accordance with this embodiment excludes non-volatile devices, thereby bringing about advantages that the write and erase circuit for non-volatile devices can be separated from the logic cell section and logic signals on the lines 731 to 736 can be created at higher speeds than in the case where non-volatile devices are used.

Figure 8:
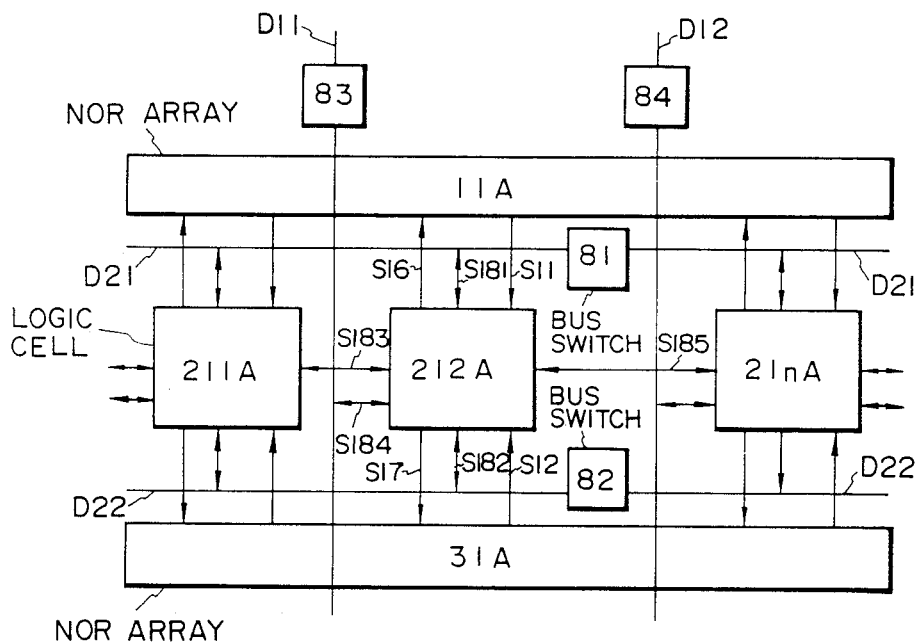
FIG. 8 is a block diagram showing the construction of another embodiment of the semiconductor logic device according to the invention.

FIG. 8 shows the construction of another embodiment of the programmable logic device. Referring to FIG. 8, 11A and 31A designate logic element arrays, for example, NOR arrays which are formed in the surface of a semiconductor substrate as described previously, 211A, 212A, ... 21nA logic cells formed in the substrate surface and constituting one of logic cell chains, the logic element arrays and the logic cell chains being arranged alternately in the vertical direction (first direction) in the drawing, D11, D12, ... designate direct interconnection lines formed in the semiconductor substrate surface to extend in the vertical direction (first direction) in the drawing, at least one (two of D11 and D12 in the drawing) of the direct interconnection lines being used, D21, D22, ... designate direct interconnection lines formed in the semiconductor substrate surface to extend in the horizontal direction (second direction) in the drawing, at least one (two of D21 and D22 in the drawing) of the direct interconnection lines being used, 83, 84, ... designate bus switches formed in the semiconductor substrate surface in order to divide the individual vertical direct interconnection lines into a plurality of line segments, at least one of the bus switches being used (in the drawing, two are illustrated in association with the D11 and D12), and 81, 82, ... designate bus switches formed in the semiconductor substrate surface in order to divide the individual horizontal direct interconnection lines into a plurality of line segments, at least one of the bus switches being used (in the drawing, two are illustrated in association with the D21 and D22). When the bus switch is selectively turned on, associated line segments are interconnected together to complete the direct interconnection line. In the drawing, the vertical (first) direction is substantially perpendicular to the direction of the logic cell chain and the horizontal (second) direction is substantially parallel to the direction of the logic cell chain. Denoted by S11 and S12 are input signal lines respectively extending from the NOR arrays 11A and 31A to the logic cell 212A, by S16 and S17 are output signal lines extending from the logic cell 212A to the adjacent NOR arrays 11A and 31A, respectively, by S181, S182 and S184 are input/output signal lines between the logic cell 212A and the individual adjacent direct interconnection lines, and by S183 and S185 are input/output signal lines between the logic cell 212A and the individual adjacent logic cells. The direct interconnection lines D11, D12 . . . and D21, D22 . . . may be used for high speed data transfer or common data transfer between the logic device and external remote logic cells or between discrete or remote modules.

In formation of IC's through multi-layer wiring process, the horizontal direct interconnection lines D21, D22 . . . and the vertical direct interconnection lines D11, D12, . . . may be formed of, for example, aluminum lines.

Obviously, the direct interconnection lines in the first direction and/or the direct interconnection lines in the second direction may be removed from the FIG. 8 device. Further, the provision of the bus switch is not always needed in the FIG. 8 device.

An embodiment of each of the logic cells 211A, 212A, . . . 21nA used in the FIG. 8 device will now be described with reference to FIG. 9. In comparison with the previous embodiment of FIG. 3, the embodiment of FIG. 9 additionally comprises a bidirectional bus driver 2114 having input/output signal lines S181 to S185. An output signal on a line S191 from an output switch circuit (multiplexer) 2113A is applied to the input of the driver 2114 and an output signal on a line S192 from the driver 2114 is applied to the input of a logic circuit 2112A. The signal propagation direction in the bidirectional driver 2114 is controlled by a signal S18 fed from the memory 2111 for storage of control parameters.

Returning to FIG. 8, each of the bus switches 81, 82, 83 and 84 may be materialized with the same circuit as that shown in FIG. 4. The FIG. 8 embodiment adds to the FIG. 1 embodiment the direct interconnection lines D11, D12, D21 and D22 and the lines S183 and S185 between adjacent logic cells, thereby ensuring that delay due to wiring can be reduced between adjacent logic cells and between discrete or remote logic cells. The bus switches 81, 82, ... may be provided in some of horizontal interconnection lines at suitable intervals so that adjacent horizontal interconnection lines removed of the bus switches may be used as independent wiring channels to ensure efficient use of the wiring area.

Figure 9:
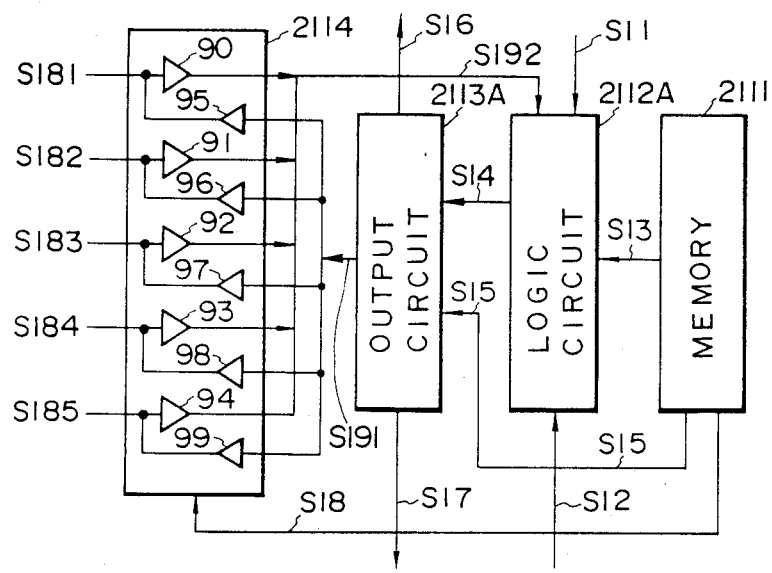
FIG. 9 is a diagram showing another embodiment of the logic cell.

If, in the FIG. 9 logic cell construction, the signal lines S181 and S182 are removed, a resulting construction may be applied directly to the logic cell shown in FIG. 1.

It should be appreciated that in the FIG. 8 embodiment each of the direct interconnection lines D11, D12, ... in the first direction may be connected to at least one logic cell of at least one of the plurality of logic cell chains and each of the direct interconnection lines D21, D22, ... in the second direction may be connected to at least one logic cell of at least one of the plurality of logic cell chains.

Figure 10:
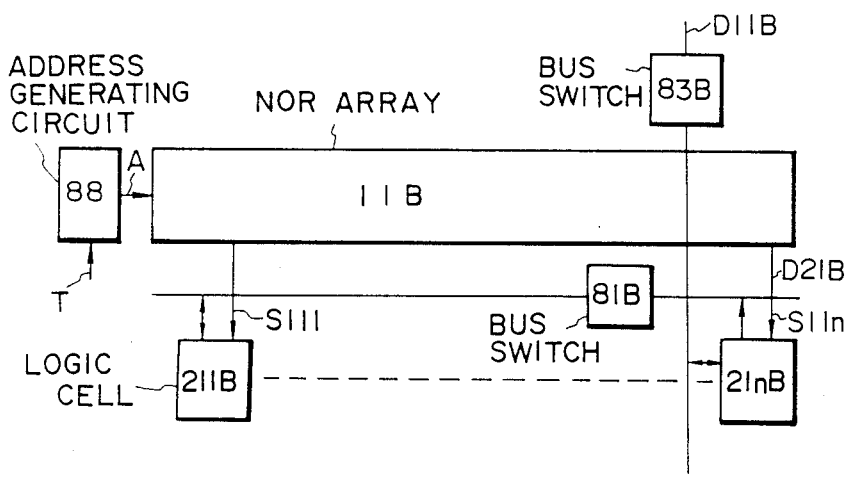
FIG. 10 is a block diagram showing the construction of a further embodiment of the semiconductor logic device according to the invention.
Figure 11:
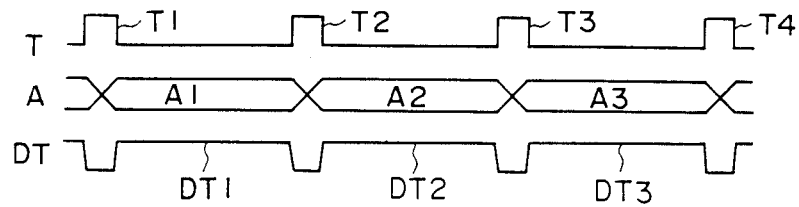
FIG. 11 is a diagram useful to explain transfer sequence on a message bus in the FIG. 10 device.

FIG. 10 shows a further embodiment of the semiconductor logic device according to the invention wherein the logic device is connected to remote logic cells through message buses. Referring to FIG. 10, at least one address generating circuit 88 is formed in the semiconductor substrate surface in association with one, 11B, of logic element arrays such as NOR arrays which are similar to those shown in FIGS. 1 and 2A and formed in the semiconductor substrate surface, and logic cell chains formed in the substrate surface and the logic arrays (NOR arrays) are arranged alternately in the first direction, one of the logic cell chains having logic cells 211B to 21nB. One or more message buses D21B are formed in the substrate surface to extend in the second direction. One or more direct interconnection lines D11B are formed in the substrate surface to extend in the first direction. A bus switch 81B is adapted to divide at least one message bus into a plurality of line segments and a bus switch 83B is adapted to divide at least one direct interconnection line into a plurality of line segments. As in the previous embodiments, the first direction is substantially perpendicular to the direction of the logic cell chain and the second direction is substantially parallel to the direction of the logic cell chain. Control sequence in the FIG. 10 embodiment is shown in FIG. 11. In synchronism with timing signals T1, T2, T3, T4, ... , the address generating circuit 88 transmits to the NOR array 11B addresses A1, A2, A3, ... , where the message bus may be used. The logic cells 211B to 21nB respond to addresses from a part of the NOR array 11B through output lines S111 to S11n. For example, given that the address A1 designates the logic cells 211B and 21nB, transfer of a signal DT1 from the external logic cell to the logic cells 211B and 21nB or signal transfer between the external logic cell and the logic cells 211B and 21nB is effected at the timing of T1 through the message bus D21B. At the next timing of T2, transfer of a signal DT2 from the external logic cell to an internal logic cell designated by the address A2 or data transfer between the external and internal logic cells is effected through the message bus D21B. In this manner, the limited wiring channel can be used on the time division basis to ensure efficient use of the wiring area. In an alternative, the FIG. 10 embodiment may be removed of the direct interconnection line in the first direction or may be removed of the bus switches 81B and 83B. Part of the NOR array 11B and part of the logic cells 211B to 21nB may be used to provide a circuit equivalent to the address generating circuit 88 of FIG. 10. In the embodiments of FIGS. 8 and 10, the number of the NOR arrays, the number of logic cell chains and the number of logic cells in each chain are not limitative and the NOR array and logic cell chain may be extended as necessary in the first and second directions. Also, the number of direct interconnection lines and the number of message buses may be set desirably.

Figure 12:
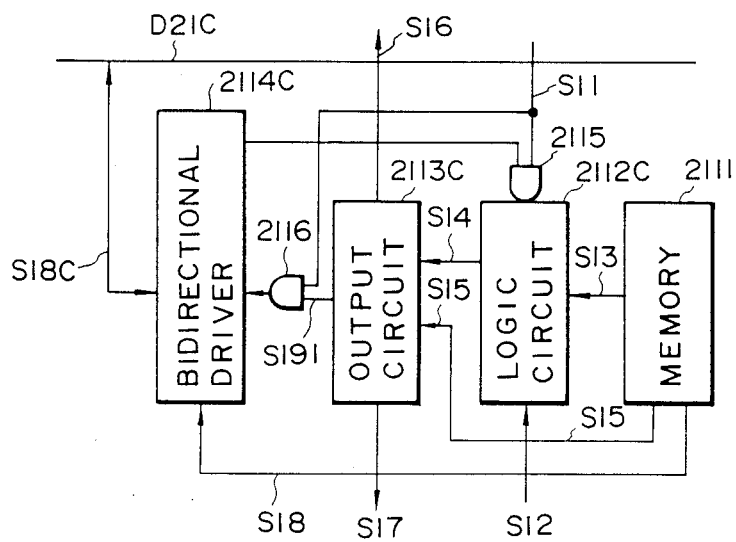
FIG. 12 is a diagram showing a further embodiment of the logic cell.

FIG. 12 shows an embodiment of the logic cell used for message transfer control in the FIG. 10 logic device. In comparison with the FIG. 9 embodiment, the embodiment of FIG. 12 additionally comprises AND gates 2115 and 2116. In a desired logic cell designated by the address generating circuit of FIG. 10, the AND gates 2115 and 2116 are enabled, thereby permitting message transfer through a message bus D21C connected to a control signal line S18C.

In the embodiments of FIGS. 8 and 10 described previously, the direct interconnection line independent of the NOR array is used to ensure high-speed signal propagation between discrete or remote logic cells and the bus switch is used to ensure high-speed operation and highly efficient use of wiring. In particular, the FIG. 10 embodiment uses, in addition to the direct interconnection line and bus switch, the message bus to permit the use of wiring on the time division basis, thereby improving the operation speed and the use efficiency of wiring.

Further, since in the foregoing embodiments the variable logic is realized with the NOR array and part of the output signal of the NOR array is set in the control parameter memory of the logic cell, the NOR logic design and logic cell structure can be changed in accordance with programs and hence the degree of freedom of the logic design can be increased.

FIG. 13 is a diagram showing an example of a circuit structure for one of the bits of each of the output signals of the output switch circuit 2113. The output signals on lines S16 and S17 (one bit) are produced as a result of logical products of AND circuits 21130 and 21131, respectively, in which the AND circuit 21130 receives the output on line S14 from the logic circuit 2112 and control signal on line S151 from the memory 2111, while the AND circuit 21131 receives the output on line S14 from the logic circuit 2112 and control signal on line S152 from the memory 2111.

We claim:

1. A semiconductor logic device comprising:
a plurality of arrays of logic elements formed in a surface portion of a semiconductor substrate, the logic element arrays being aligned in a first direction, each of said logic element arrays having input and output leads extending from the array in said first direction; and
a plurality of chains of logic cells formed in said surface portion of said semiconductor substrate, the logic cell chains being aligned in said first direction, said first direction being substantially perpendicular to the direction of extension of said logic cells in each of said chains, said logic element arrays and said logic cell chains being alternately arranged in said substrate so that each of said logic cell chains is in an electrical connection with two adjacent logic element arrays via said input and output leads, wherein each of said arrays of logic elements includes:

a plurality of common input lines extending in parallel in a second direction substantially perpendicular to said first direction, said common input lines being electrically connected with said input leads;

a plurality of output lines extending in parallel in said first direction and intersecting with said common input lines, said output lines being electrically connected with corresponding ones of said output leads; and a programmable element formed at each of the intersections between said common input lines and said output lines.

2. A semiconductor logic device according to claim 2, in which each of said programmable elements is a non-volatile memory element.

3. A semiconductor logic device according to claim 1, in which each of the logic cells in said logic cell chains includes:

means for storing therein operation control parameters;

logic circuit means connected with output leads of two adjacent logic element arrays and responsive to a first portion of the output of said operation parameter storing means for providing logic operation results with signals supplied from said output leads of said two adjacent logic element arrays and said first portion of the output of said logical operation parameter storing means; and output means connected with input leads of said two adjacent logic element arrays and connected to receive the output of said logic circuit means and deliver in response to a second portion of said output of said operation parameter storing means for providing first and second outputs on said input leads of said two adjacent logic element arrays.

4. A semiconductor logic device according to claim 2, in which each of the logic cells in said logic cell chains includes:

means for storing therein operation control parameters;

logic circuit means connected with output leads of two adjacent logic element arrays and responsive to a first portion of the output of said operation parameter storing means for providing logic operation results with signals supplied from said output leads of said two adjacent logic element arrays and said first portion of the output of said logical operation parameter storing means; and output means connected with input leads of said two adjacent logic element arrays and connected to receive the output of said logic circuit means and deliver in response to a second portion of said output of said operation parameter storing means for providing first and second outputs on said input leads of said two adjacent logic element arrays.

5. A semiconductor logic device according to claim 1, in which each of the logic cells in said logic cell chains includes:

means for storing therein operation control parameters;

logic circuit means connected with output leads of two adjacent logic element arrays and responsive to a first portion of the output of said operation parameter storing means for providing logic operation results with signals supplied from said output leads of said two adjacent logic element arrays and said first portion of the output of said logical operation parameter storing means;

output means connected with input leads of said two adjacent logic element arrays and connected to receive the output of said logic circuit means and deliver in response to a second portion of said output of said operation parameter storing means for providing first and second outputs on said input leads of said two adjacent logic element arrays and a third output; and bidirectional driver means operable in operation modes to receive at least one of signals from logic cells adjacent to a logic cell under consideration and to supply at least one of output signals of the logic cell under consideration to logic cells adjacent to the logic cell under consideration, the operation mode of said bidirectional driver means being determined by a third portion of said output of said operation parameter storing means.

6. A semiconductor logic device according to claim 2, in which each of the logic cells in said logic cell chains includes:

means for storing therein operation control parameters;

logic circuit means connected with output leads of two adjacent logic element arrays and responsive to a first portion of the output of said operation parameter storing means for providing logic operation results with signals supplied from said output leads of said two adjacent logic element arrays and said first portion of the output of said logical operation parameter storing means;

output means connected with input leads of said two adjacent logic element arrays and connected to receive the output of said logic circuit means and deliver in response to a second portion of said output of said operation parameter storing means for providing first and second outputs on said input leads of said two adjacent logic element arrays and a third output; and bidirectional driver means operable in operation modes to receive at least one of signals from logic cells adjacent to a logic cell under consideration and to supply at least one of output signals of the logic cell under consideration to logic cells adjacent to the logic cell under consideration, the operation mode of said bidirectional driver means being determined by a third portion of said output of said operation parameter storing means.

7. A semiconductor logic device comprising:

a plurality of arrays of logic elements formed in a surface portion of a semiconductor substrate, the logic element arrays being aligned in a first direction, each of said logic element arrays having input and output leads extending from the array in said first direction; and a plurality of chains of logic cells formed in said surface portion of said semiconductor substrate, the logic cell chains being aligned in said first direction, said first direction being substantially perpendicular to the direction of extension of said logic cells in each of said chains, said logic element arrays and said logic cell chains being alternately arranged in said substrate so that each of said logic cell chains is in an electrical connection with two adjacent logic element arrays via said input and output leads, wherein each of the logic cells in said logic cell chains includes:

means for storing therein operation control parameters;

logic circuit means connected with output leads of two adjacent logic element arrays and responsive to a first portion of the output of said operation parameter storing means for providing logic operation results with signals supplied from said output leads of said two adjacent logic element arrays and said first portion of the output of said logical operation parameter storing means; and output means connected with input leads of said two adjacent logic element arrays and connected to receive the output of said logic circuit means and deliver in response to a second portion of said output of said operation parameter storing means for providing first and second outputs on said input leads of said two adjacent logic element arrays.

8. A semiconductor logic device comprising:

a plurality of arrays of logic elements formed in a surface portion of a semiconductor substrate, the logic element arrays being aligned in a first direction, each of said logic element arrays having input and output leads extending from the array in said first direction; and a plurality of chains of logic cells formed in said surface portion of said semiconductor substrate, the logic cell chains being aligned in said first direction, said first direction being substantially perpendicular to the direction of extension of said logic cells in each of said chains, said logic element arrays and said logic cell chains being alternately arranged in said substrate so that each of said logic cell chains is in an electrical connection with two adjacent logic element arrays via said input and output leads, wherein each of the logic cells in said logic cell chains includes:

means for storing therein operation control parameters;

logic circuit means connected with output leads of two adjacent logic element arrays and responsive to a first portion of the output of said operation parameter storing means for providing logic operation results with signals supplied from said output leads of said two adjacent logic element arrays and said first portion of the output of said logical operation parameter storing means;

output means connected with input leads of said two adjacent logic element arrays and connected to receive the output of said logic circuit means and deliver in response to a second portion of said output of said operation parameter storing means for providing first and second outputs on said input leads of said two adjacent logic element arrays and a third output; and bidirectional driver means operable in operation modes to receive at least one of signals from logic cells adjacent to a logic cell under consideration and to supply at least one of output signals of the logic cell under consideration to logic cells adjacent to the logic cell under consideration, the operation mode of said bidirectional driver means being determined by a third portion of said output of said operation parameter storing means.

9. A semiconductor logic device comprising:

a plurality of arrays of logic elements formed in a surface portion of a semiconductor substrate, the logic element arrays being arranged in first and second directions substantially perpendicular to each other, each of said logic element arrays having input and output leads extending from the array in said first direction;

a plurality of chains of logic cells formed in said surface portion of said substrate, the logic cell chains being arranged in said first and second directions, the direction of said logic cell chains being substantially parallel with said second direction;

said logic element arrays and said logic cell chains being alternately arranged in said first direction in said substrate so that each of said logic cell chains is in an electrical connection with two adjacent logic element arrays via said input and output leads; and a plurality of switching circuits each provided between two adjacent logic element arrays in said second direction for a selective interconnection therebetween.

10. A semiconductor logic device according to claim 9, further comprising at least one direct interconnection line formed in said surface portion of said substrate and extending in said first direction for direct connection in said first direction of at least one of the logic cells in at least one of said logic cell chains.

11. A semiconductor logic device according to claim 10, further comprising at least one bus switch formed in said surface portion of said substrate and provided for dividing at least one of said interconnection lines extending in said first direction into a plurality of interconnection line segments so that they are connected with each other to form said interconnection line when said bus switch is turned on.

12. A semiconductor logic device according to claim 10, further comprising at least one direct interconnection line formed in said surface portion of said substrate and extending in said second direction for direct connection in said second direction of at least one of the logic cells in at least one of said logic cell chains.

13. A semiconductor logic device according to claim 12, in which each of the logic cells in said logic cell chains includes:

means for storing therein operation control parameters;

logic circuit means connected with output leads of two adjacent logic element arrays and responsive to a first portion of the output of said operation parameter storing means for providing logic operation results with signals supplied from said output leads of said two adjacent logic element arrays and said first portion of the output of said logical operation parameter storing means;

output means connected with input leads of said two adjacent logic element arrays and connected to receive the output of said logic circuit means and deliver in response to a second portion of said output of said operation parameter storing means for providing first and second outputs on said input leads of said two adjacent logic element arrays and a third output; and bidirectional driver means operable both in a signal receiving operation mode to receive at least one of signals from logic cells adjacent to the logic cell under consideration and from said direct connection lines extending in said first and second directions and to deliver said at least one received signal to said logic circuit means and in a signal sending operation mode to supply at least one of output signals of the logic cell under consideration to at least one of logic cells adjacent to the logic cell under consideration and said direct connection lines extending in said first and second directions, the operation mode of said bidirectional driver means being determined by a third portion of said output of said operation parameter storing means.

14. A semiconductor logic device according to claim 12, further comprising bus switches formed in said surface portion of said substrate and provided for dividing at least one of said interconnection lines extending in said first direction into a plurality of interconnection line segments and at least one of said interconnection lines extending in said second direction into a plurality of interconnection line segments so that the interconnection line segments are connected with each other to form said interconnection lines when said bus switches are turned on.

15. A semiconductor logic device according to claim 9, further comprising at least one direct interconnection line formed in said surface portion of said substrate and extending in said second direction for direct connection in said second direction of at least one of the logic cells in at least one of said logic cell chains.

16. A semiconductor logic device according to claim 15, further comprising at least one bus switch formed in said surface portion of said substrate and provided for dividing at least one of said interconnection lines extending in said second direction into a plurality of interconnection line segments so that they are connected with each other to form said interconnection line when said bus switch is turned on.

17. A semiconductor logic device according to claim 9, in which each of the logic cells in said logic cell chains includes:

means for storing therein operation control parameters;

logic circuit means connected with output leads of two adjacent logic element arrays and responsive to a first portion of the output of said operation parameter storing means for providing logic operation results with signals supplied from said output leads of said two adjacent logic element arrays and said first portion of the output of said logical operation parameter storing means;

output means connected with input leads of said two adjacent logic element arrays and connected to receive the output of said logic circuit means and deliver in response to a second portion of said output of said operation parameter storing means for providing first and second outputs on said input leads of said two adjacent logic element arrays and a third output; and bidirectional driver means operable in operation modes to receive at least one of signals from at least one of logic cells adjacent to a logic cell under consideration and to supply at least one of output signals of the logic cell under consideration to at least one of logic cells adjacent to the logic cell under consideration, the operation mode of said bidirectional driver means being determined by a third portion of said output of said operation parameter storing means. second portion of said output of said operation parameter storing means for providing first and second outputs on said input leads of said two adjacent logic element arrays and a third output; and bidirectional driver means operable in operation modes to receive at least one of signals from logic cells adjacent to a logic cell under consideration and to supply at least one of output signals of the logic cell under consideration to logic cells adjacent to the logic cell under consideration, the operation mode of said bidirectional driver means being determined by a third portion of said output of said operation parameter storing means.

18. A semiconductor logic device according to claim 9, further comprising at least one address generating circuit each formed in said surface portion of said substrate and provided for one of said arrays of logic elements, at least one signal transmission line extending in said second direction and connected to a plurality of logic cells in a chain of logic cells which is adjacent to said arrays of logic elements as viewed in said first direction so that signal transmission is made to those of said logic cells in said logic cell chain which are specified by said arrays of logic elements addressed by said address generating circuit.

19. A semiconductor logic device according to claim 18, further comprising at least one bus switch formed in said surface portion of said substrate and provided for dividing at least one of said signal transmission lines extending in said second direction into a plurality of transmission line segments so that they are connected with each other to form said signal transmission line when said bus switch is turned on.

20. A semiconductor logic device according to claim 18, further comprising at least one direct interconnection line formed in said surface portion of said substrate and extending in said first direction for direct connection in said first direction of at least one of the logic cells in at least one of said logic cell chains.

21. A semiconductor logic device according to claim 20, further comprising at least one bus switch formed in said surface portion of said substrate and provided for dividing at least one of said interconnection lines extending in said first direction into a plurality of interconnection line segments so that they are connected with each other to form said interconnection line when said bus switch is turned on.

22. A semiconductor logic device according to claim 18, in which each of the logic cells in said logic cell chains includes:

means for storing therein operation control parameters;

a first AND gate having one of its input terminals connected with an output lead of one of two adjacent logic element arrays;

logic circuit means connected with the output of said first AND gate and with an output lead of the other adjacent element array, said logic circuit means being responsive to a first portion of the output of said operation parameter storing means for providing logic operation results with signals supplied from said output leads of said two adjacent logic element arrays and said first portion of the output of said logical operation parameter storing means;

output means connected with input leads of said two adjacent logic element arrays and connected to receive the output of said logic circuit means and deliver in response to a second portion of said output of said operation parameter storing means for providing first and second outputs on said input leads of said two adjacent logic element arrays and a third output;

a second AND gate having one of its input terminals connected with said output lead of said one adjacent logic element array and the other input terminal connected to receive said third output of said output means; and bidirectional driver means operable both in a signal receiving operation mode to receive at least one of signals from logic cells adjacent to the logic cell under consideration and from said at least one direct connection line extending in said first direction and at least one signal transmission line extending in said second direction and to deliver said at least one received signal to the other input terminal of said first AND gate and in a signal sending operation mode to supply at least one of output signals of the logic cell under consideration to at least one of logic cells adjacent to the logic cell under consideration, said direct connection line and said signal transmission line, the operation mode of said bidirectional driver means being determined by a third portion of said output of said operation parameter storing means.

23. A semiconductor logic device according to claim 9, in which each of said arrays of logic elements includes:

a plurality of common input lines extending in parallel in a second direction substantially perpendicular to said first direction, said common input lines being electrically connected with said input leads;

a plurality of output lines extending in parallel in said first direction and intersecting with said common input lines, said output lines being electrically connected with corresponding ones of said output leads; and a programmable element formed at each of the intersections between said common input lines and said output lines.

24. A semiconductor logic device according to claim 9, in which each of said programmable elements is a non-volatile memory element.

* * * * *